United States Patent
Chivukula et al.

(10) Patent No.: US 6,312,999 B1
(45) Date of Patent: Nov. 6, 2001

(54) METHOD FOR FORMING PLDD STRUCTURE WITH MINIMIZED LATERAL DOPANT DIFFUSION

(75) Inventors: Subrahamanyam Chivukula; Yelehanka Ramachandramurthy Pradeep; Madhusudan Mukhopdhyay; Palanivel Balasubramaniam, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/819,378

(22) Filed: Mar. 29, 2001

(51) Int. Cl.[7] .................. H01L 21/336; H01L 21/3205
(52) U.S. Cl. ................. 438/303; 438/305; 438/592
(58) Field of Search .................. 438/303, 305, 438/592, 595, 301, 229, 230; 257/369, 397, 283, 410, 401

(56) References Cited

U.S. PATENT DOCUMENTS

| | | | |
|---|---|---|---|
| 4,744,859 | * | 5/1988 | Hu et al. .................. 437/34 |
| 5,866,460 | * | 2/1999 | Akram et al. .................. 438/306 |
| 5,913,112 | * | 6/1999 | Yamazaki et al. .................. 438/165 |
| 5,969,395 | * | 10/1999 | Lee .................. 257/408 |
| 5,969,398 | * | 10/1999 | Murakami .................. 257/412 |
| 5,994,192 | * | 11/1999 | Chen .................. 438/303 |
| 5,998,274 | * | 12/1999 | Akram et al. .................. 438/306 |
| 6,017,802 | * | 1/2000 | Gardner et al. .................. 438/303 |
| 6,027,520 | * | 3/2001 | Gardner et al. .................. 438/303 |
| 6,051,863 | * | 4/2000 | Hause et al. .................. 438/230 |
| 6,093,587 | * | 7/2000 | Ohtari .................. 438/166 |
| 6,110,790 | * | 8/2000 | Chen .................. 438/305 |
| 6,133,122 | * | 10/2000 | Yamamoto et al. .................. 438/514 |
| 6,162,694 | * | 12/2000 | Cheek et al. .................. 438/305 |
| 6,168,999 | * | 1/2001 | Xiang et al. .................. 438/286 |
| 6,204,136 | * | 3/2001 | Chan et al. .................. 438/305 |
| 6,245,624 | * | 6/2001 | Kim et al. .................. 438/305 |

* cited by examiner

*Primary Examiner*—Michael Lebentritt
(74) *Attorney, Agent, or Firm*—George O. Saile; Rosemary L. S. Pike

(57) ABSTRACT

A method for forming a MOSFET having an LDD structure with minimal lateral dopant diffusion is described. A gate electrode is provided overlying a gate dielectric layer on a semiconductor substrate. Dielectric spacers are formed on sidewalls of the gate electrode. Source and drain regions are formed associated with the gate electrode. The gate electrode and source and drain regions are silicided. Thereafter, the spacers are removed to expose the semiconductor substrate. LDD regions are formed using plasma doping in the exposed semiconductor substrate between the source and drain regions and the gate electrode to complete formation of an LDD structure in the fabrication of an integrated circuit device.

20 Claims, 3 Drawing Sheets

METHOD FOR FORMING PLDD STRUCTURE WITH MINIMIZED LATERAL DOPANT DIFFUSION

BACKGROUND OF THE INVENTION

1. Field of the Invention

The invention relates to the fabrication of integrated circuit devices, and more particularly, to a method of forming an LDD structure with minimal lateral dopant diffusion in the fabrication of integrated circuits.

2. Description of the Prior Art

As the physical geometry of semiconductor devices shrinks, the channel length of the transistor is reduced as well. This leads to serious short channel effects. Since boron has a high diffusivity in the silicon substrate, lateral dopant diffusion is quite prominent when boron is used as the dopant for a PLDD structure. This lateral dopant diffusion will affect the threshold voltage and transistor current drive, thus affecting the device performance. In the traditional process flow, PLDD implantation is performed prior to source/drain implantation and annealing. The annealing process will enhance boron diffusion from the PLDD area into the channel underlying the gate electrode, causing the problems mentioned above.

U.S. Pat. No. 5,969,398 to Murakami teaches plasma doping of the gate and source/drain regions. U.S. Pat. Nos. 5,866,460 and 5,998,274, both to Akram et al teach a method to form source and drain subregions each having a different dopant concentration in a polycide process. U.S. Pat. No. 5,913,112 to Yamazaki et al discloses formation of LDD regions after the gate has been oxidized. The oxidized portion of the gate acts as a mask for the LDD implantation.

SUMMARY OF THE INVENTION

A principal object of the present invention is to provide an effective and very manufacturable method of forming a MOSFET having an LDD structure.

A further object of the invention is to provide a method of forming a MOSFET having an LDD structure with minimal lateral dopant diffusion.

Yet another object is to provide a method of forming a MOSFET having a PLDD structure with minimal lateral dopant diffusion.

Yet another object is to provide a method of forming a MOSFET having a PLDD structure with minimal lateral boron dopant diffusion.

A still further object of the invention is to provide a method of forming a MOSFET having an LDD structure with minimal lateral dopant diffusion wherein the LDD structure is formed after S/D implantation and annealing.

Another still further object of the invention is to provide a method of forming a MOSFET having an LDD structure with minimal lateral dopant diffusion wherein the LDD structure is formed after S/D implantation, annealing, and silicidation.

Yet another object of the invention is to provide a method of forming a MOSFET having an LDD structure with minimal lateral dopant diffusion wherein the LDD structure is formed by plasma doping after S/D implantation, annealing, and silicidation.

In accordance with the objects of this invention a method for forming a MOSFET having an LDD structure with minimal lateral dopant diffusion is achieved. A gate electrode is provided overlying a gate dielectric layer on a semiconductor substrate. Dielectric spacers are formed on sidewalls of the gate electrode. Source and drain regions are formed associated with the gate electrode. The gate electrode and source and drain regions are silicided. Thereafter, the spacers are removed to expose the semiconductor substrate. LDD regions are formed by plasma doping in the exposed semiconductor substrate between the source and drain regions and the gate electrode to complete formation of an LDD structure in the fabrication of an integrated circuit device.

BRIEF DESCRIPTION OF THE DRAWINGS

In the accompanying drawings forming a material part of this description, there is shown.

DESCRIPTION OF THE PREFERRED EMBODIMENTS

It will be understood by those skilled in the art that while FIGS. 1 through 5 illustrate a P channel MOSFET integrated circuit device, an N channel FET integrated circuit device could be formed simply by substituting opposite polarities to those given for the P channel embodiment. Also, in a similar way, a CMOSFET could be formed by making both N channel and P channel devices upon the same substrate. The process of the present invention is especially critical in forming a P channel MOSFET device because boron, typically used to form PLDD structures, is especially prone to lateral dopant diffusion. The process of the present invention will minimize lateral dopant diffusion even in the case of boron implantation.

Figure 1:
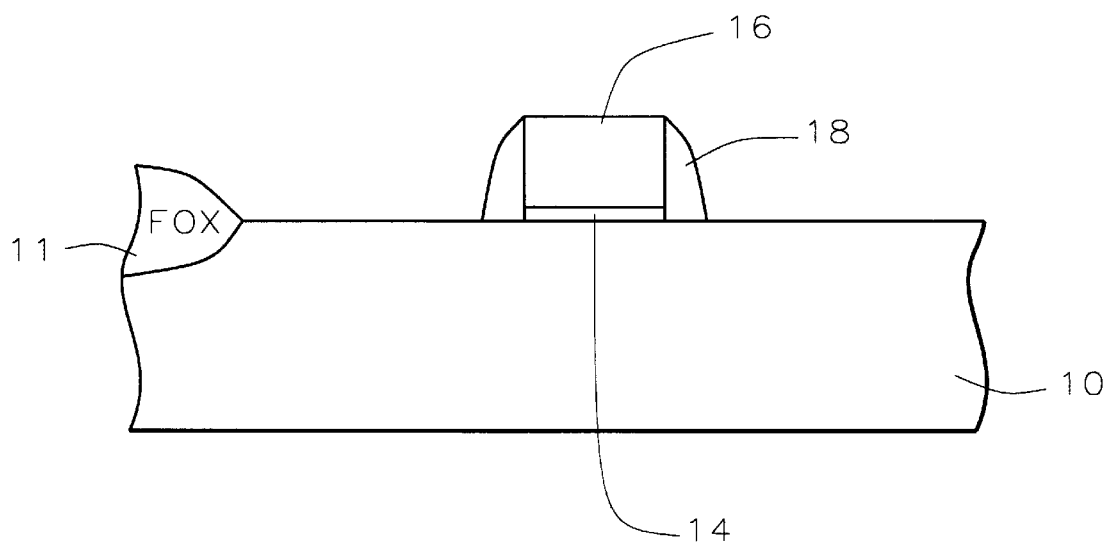
FIGS. 1 through 5 schematically illustrate in cross-sectional representation a preferred embodiment of the present invention.

Referring now more particularly to FIG. 1, there is shown an illustration of a portion of a partially completed metal oxide field effect transistor (MOSFET). The semiconductor substrate 10 is preferably composed of silicon having a (100) crystallographic orientation and has been doped to be a p-type substrate.

In an effort to simplify the description and the drawings the dielectric isolation between devices has been only partially shown and will not be described in detail, because they are conventional. For example, Field OXide regions FOX 11 can be formed in and on the semiconductor substrate.

A gate dielectric layer 14 is grown or deposited to a thickness of between about 20 and 200 Angstroms on the semiconductor substrate. A conductive layer such as polysilicon is deposited over the gate dielectric and patterned to form gate electrode 16, as shown. Spacers 18 are formed on the sidewalls of gate electrode 16. The spacers may comprise silicon nitride, silicon dioxide, or silicon oxynitride, for example. The spacers are formed by depositing the dielectric layer overlying the substrate and the gate electrode and anisotropically etching back the dielectric layer to leave the spacers 18 on the sidewalls of the gate electrode. The spacers may have a width of between about 500 and 1500 Angstroms.

Figure 2:
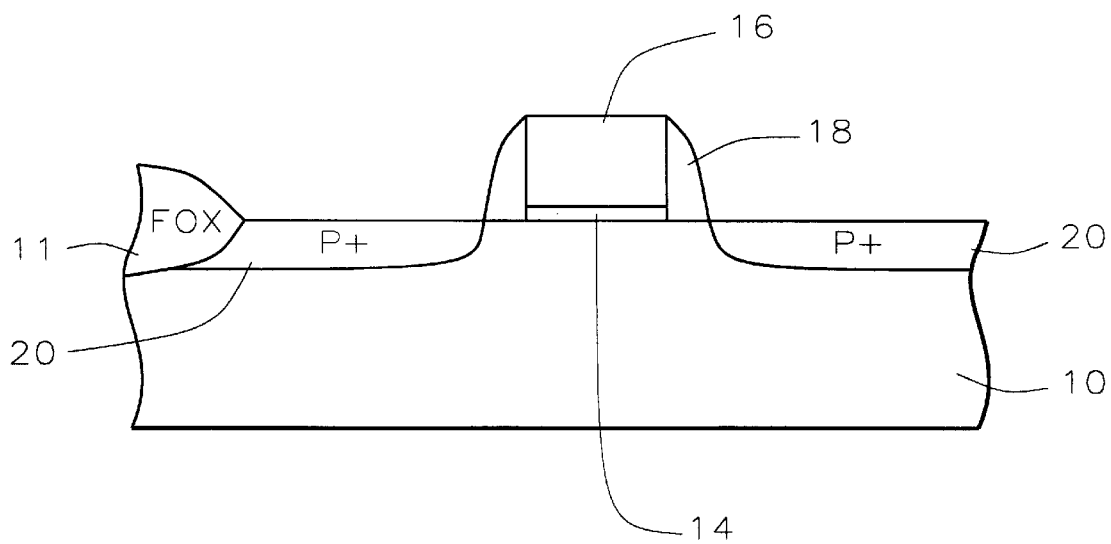

Now, referring to FIG. 2, ions are implanted into the surface of the substrate to form source and drain regions 20. For example, PMOS heavily doped source and drain regions 20 may be formed by implanting boron or $BF_2$ ions into the substrate at an energy of 2 to 60 KeV and dosage of 1 E 15 to 6 E 15 atoms/cm². NMOS heavily doped source and drain regions 20 may be formed by implanting arsenic or antimony ions into the substrate at an energy of 20 to 60 KeV and dosage of 1 E 15 to 6 E 15 atoms/cm². The source/drain regions may be formed by plasma doping instead of by ion implantation as described. The ions are driven in, for example, by a rapid thermal annealing (RTA) at between about 800 to 1050° C. for 15 to 35 seconds.

Now, the gate and source/drain regions are to be silicided. It is important to the process of the present invention that both the source/drain implantation and annealing and silicidation be performed prior to LDD formation in order to minimize lateral dopant diffusion which is caused by high temperature processing. If silicidation were to be performed after LDD formation, the silicidation of the LDD regions would increase leakage current. In addition, if the silicidation were to be performed after LDD formation when the spacers have been removed from the gate sidewalls, the gate sidewalls would also be silicided resulting in a leakage path from the source/drain to the gate.

Figure 3:
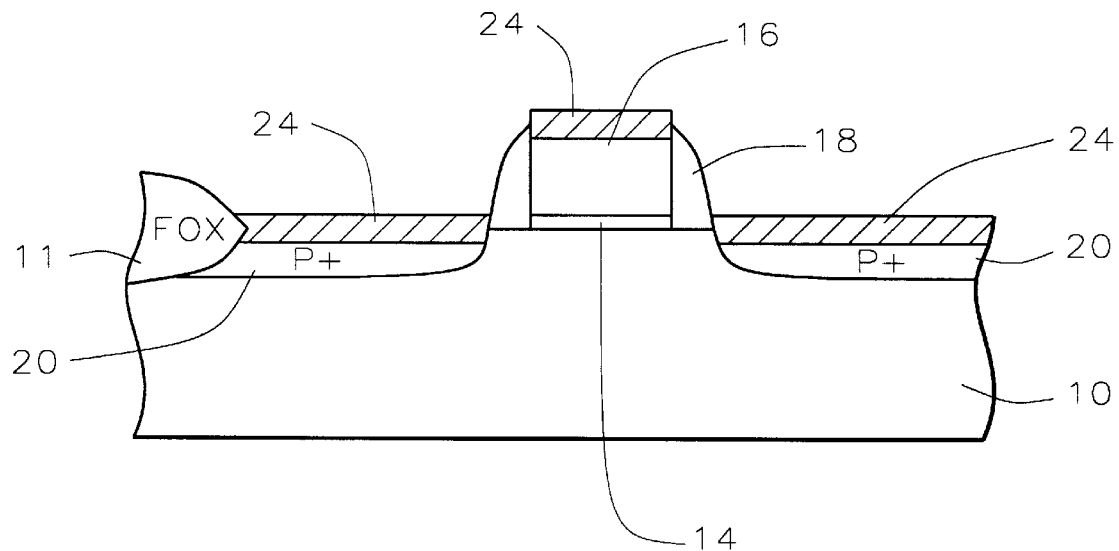

Referring now to FIG. 3, the gate 16 and source/drain regions 20 are silicided 24 by any of the conventional methods. For example, a metal layer such as titanium or cobalt may be deposited over the substrate and the gate electrode. The wafer is subjected to an annealing process. The metal layer overlying the polysilicon gate electrode and overlying the silicon substrate in the source and drain regions 20 is transformed to a metal silicide 24. The metal overlying the spacers 18 and FOX regions 11 is unreacted. The unreacted metal is removed to complete the silicidation process.

Figure 4:
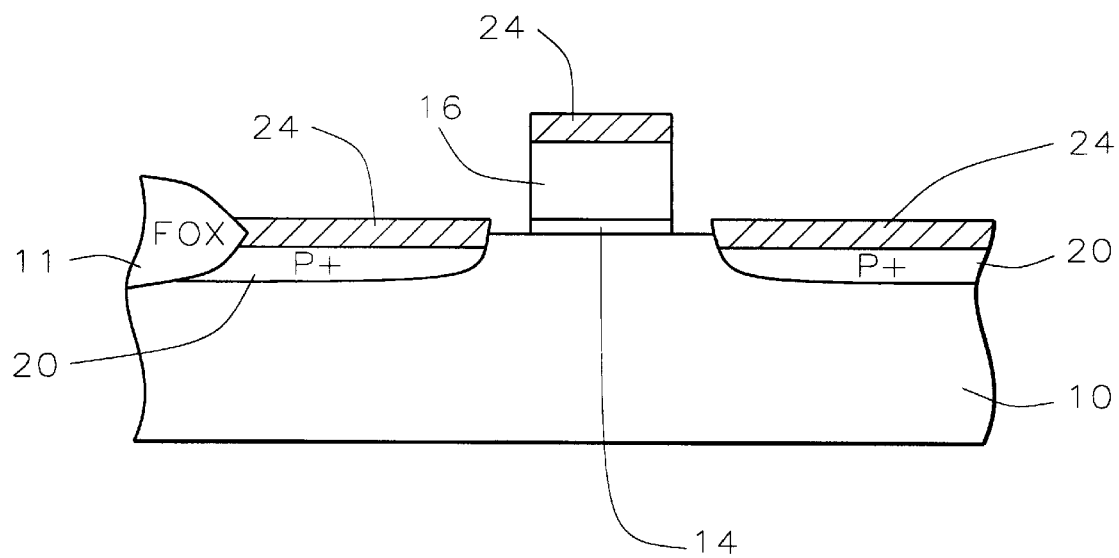

Now, the spacers 18 are removed. For example, if the spacers comprise silicon nitride, they may be removed using hot phosphoric acid. The wafer after spacer removal is illustrated in FIG. 4.

Figure 5:
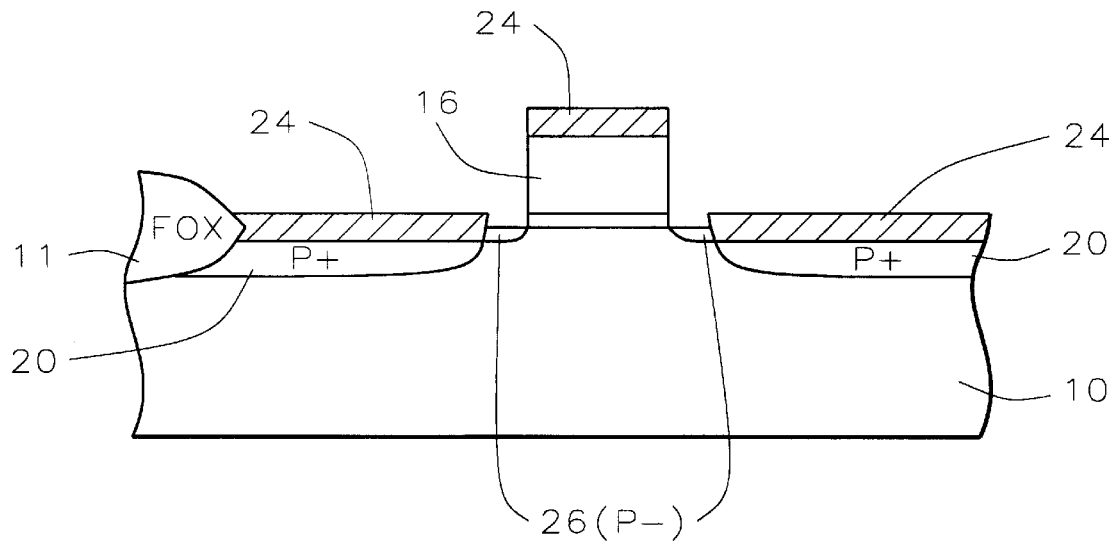

Now, the LDD regions will be formed. Referring to FIG. 5, LDD regions 26 are formed by a plasma doping process. The plasma doping process does not affect the silicidation of the gate and source/drain regions. Typical plasma doping (PLAD) processes use a voltage in the range of 1000 to 5000 volts to pulse the wafer and draw the dopants out of the plasma above the wafer. Low energy PLAD uses voltages on the order of 100 volts to draw the dopant out of the plasma with much less acceleration, resulting in much more shallow implants. Low energy PLAD is preferred in the process of the present invention. Plasma doping provides the additional advantages of shallow junctions and a flatter plateau region in the depth profile after annealing as compared to a standard ion implantation process. Conformal doping is also achieved in the plasma doping process.

FIG. 5 illustrates LDD regions 26 formed by the low energy plasma doping process of the present invention. PLDD regions are illustrated. It is to be understood that NLDD regions could be formed according to the same process of the present invention. However, dopant diffusion is a more significant problem for PLDD than for NLDD. The process of the present invention minimizes lateral dopant diffusion even in the PLDD case.

Figure 6:
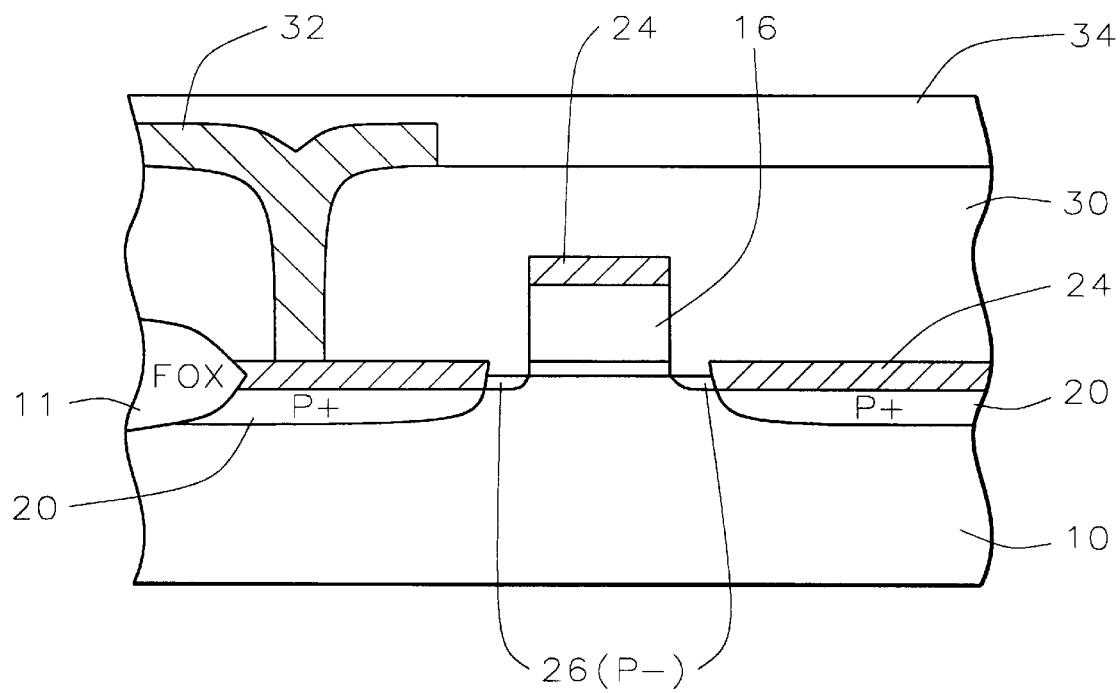
FIG. 6 schematically illustrates in cross-sectional representation a completed integrated circuit device fabricated according to the process of the present invention.

This completes the formation of the LDD structure. The integrated circuit device is completed as is conventional in the art. For example, as illustrated in FIG. 6, insulating layer 30 is deposited over the surface of the substrate. Contact openings are made through the insulating layer to the underlying semiconductor devices, such as to silicided source region 20. A metal layer 32 is deposited and patterned to form electrical connections between the elements of the integrated circuit. A passivation layer 34 completes the fabrication of the integrated circuit.

The process of the invention provides a MOSFET device with an LDD structure with minimized lateral dopant diffusion. The process of the invention forms the LDD structure after the source/drain implantation and annealing and after silicidation, thus minimizing lateral dopant diffusion. Plasma doping is used to form the LDD regions. The process of the present invention is suitable for both NMOS and PMOS devices, but is especially useful in forming PMOS devices because lateral dopant diffusion is more critical in PMOS devices than in NMOS devices.

While the invention has been particularly shown and described with reference to the preferred embodiments thereof, it will be understood by those skilled in the art that various changes in form and details may be made without departing from the spirit and scope of the invention.

What is claimed is:

1. A method of forming an LDD structure in the fabrication of an integrated circuit device comprising:

providing a gate electrode overlying a gate dielectric layer on a semiconductor substrate;

forming dielectric spacers on sidewalls of said gate electrode;

forming source and drain regions associated with said gate electrode;

siliciding said gate electrode and said source and drain regions;

thereafter removing said spacers to expose said semiconductor substrate; and forming LDD regions in said exposed semiconductor substrate between said source and drain regions and said gate electrode to complete formation of said LDD structure in said fabrication of said integrated circuit device.

2. The method according to claim 1 wherein said dielectric spacers are chosen from the group containing silicon nitride, silicon dioxide, and silicon oxynitride and have a width of between about 500 and 1500 Angstroms.

3. The method according to claim 1 wherein said step of forming said source and drain regions comprises ion implanting and annealing.

4. The method according to claim 1 wherein said step of forming said source and drain regions comprises plasma doping.

5. The method according to claim 1 wherein said step of removing said spacers uses hot phosphoric acid.

6. The method according to claim 1 wherein said step of forming said LDD regions comprises plasma doping at an energy of less than 500 volts.

7. The method according to claim 1 wherein said LDD regions are chosen from the group containing: PLDD regions and NLDD regions.

8. A method of forming an LDD structure in the fabrication of an integrated circuit device comprising:

providing a gate electrode overlying a gate dielectric layer on a semiconductor substrate;

forming dielectric spacers on sidewalls of said gate electrode;

forming source and drain regions associated with said gate electrode;

siliciding said gate electrode and said source and drain regions;

thereafter removing said spacers to expose said semiconductor substrate; and forming LDD regions in said exposed semiconductor substrate between said source and drain regions and said gate electrode using plasma doping to complete formation of said LDD structure in said fabrication of said integrated circuit device.

9. The method according to claim 8 wherein said dielectric spacers are chosen from the group containing silicon nitride, silicon dioxide, and silicon oxynitride and have a width of between about 500 and 1500 Angstroms.

10. The method according to claim 8 wherein said step of forming said source and drain regions comprises ion implanting and annealing.

11. The method according to claim 8 wherein said step of forming said source and drain regions comprises plasma doping.

12. The method according to claim 8 wherein said step of removing said spacers uses hot phosphoric acid.

13. The method according to claim 8 wherein said step of forming said LDD regions comprises plasma doping at an energy of less than 500 volts.

14. The method according to claim 8 wherein said LDD regions are chosen from the group containing: PLDD regions and NLDD regions.

15. A method of forming an LDD structure in the fabrication of an integrated circuit device comprising:

providing a gate electrode overlying a gate dielectric layer on a semiconductor substrate;

forming dielectric spacers on sidewalls of said gate electrode;

forming source and drain regions associated with said gate electrode;

siliciding said gate electrode and said source and drain regions;

thereafter removing said spacers to expose said semiconductor substrate; and forming LDD regions in said exposed semiconductor substrate between said source and drain regions and said gate electrode using plasma doping at an energy of less than 500 volts to complete formation of said LDD structure in said fabrication of said integrated circuit device.

16. The method according to claim 15 wherein said dielectric spacers are chosen from the group containing silicon nitride, silicon dioxide, and silicon oxynitride and have a width of between about 500 and 1500 Angstroms.

17. The method according to claim 15 wherein said step of forming said source and drain regions comprises ion implanting and annealing.

18. The method according to claim 15 wherein said step of forming said source and drain regions comprises plasma doping.

19. The method according to claim 15 wherein said step of removing said spacers uses hot phosphoric acid.

20. The method according to claim 15 wherein said LDD regions are chosen from the group containing: PLDD regions and NLDD regions.

* * * * *